(12) United States Patent
Shiroyama et al.

(10) Patent No.: US 9,537,417 B2
(45) Date of Patent: Jan. 3, 2017

(54) POWER SUPPLY CONTROL CIRCUIT AND POWER SOURCE CUT-OFF DETECTION METHOD

(71) Applicant: FUJI ELECTRIC CO., LTD., Kawasaki (JP)

(72) Inventors: Hironobu Shiroyama, Hino (JP); Takato Sugawara, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 534 days.

(21) Appl. No.: 13/765,149

(22) Filed: Feb. 12, 2013

(65) Prior Publication Data

US 2013/0147440 A1    Jun. 13, 2013

Related U.S. Application Data

(63) Continuation of application No. PCT/JP2011/070345, filed on Sep. 7, 2011.

(30) Foreign Application Priority Data

Sep. 10, 2010   (JP) .................................. 2010-202903
Mar. 29, 2011   (JP) .................................. 2011-072037

(51) Int. Cl.
*H02M 7/02*    (2006.01)
*G01R 31/40*    (2014.01)
(Continued)

(52) U.S. Cl.
CPC ................ *H02M 7/02* (2013.01); *G01R 31/40* (2013.01); *H02M 7/217* (2013.01); *H02M 1/126* (2013.01);
(Continued)

(58) Field of Classification Search
CPC .................................. H02J 7/345; H02M 7/02
(Continued)

(56) References Cited

U.S. PATENT DOCUMENTS 3,813,487 A * 5/1974 Cowham et al. ............. 348/573
5,834,857 A * 11/1998 Abe et al. ....................... 307/66
(Continued)

FOREIGN PATENT DOCUMENTS

CN    1909350       2/2007
JP    63-209465     8/1988
(Continued)

OTHER PUBLICATIONS

Japanese Office Action dated Mar. 25, 2014 in corresponding Japanese Patent Application No. 2012-532997.
(Continued)

*Primary Examiner* — Samuel Berhanu
*Assistant Examiner* — Tessema Kebede

(57) ABSTRACT

A power supply control circuit arranged to prevent a steady power loss from occurring in an input filter connected to an alternating current power source. In order to detect that an AC input has been turned off, diodes are connected to AC lines, thus detecting a full-wave rectified waveform. This detected voltage is compared with a reference voltage by a comparator. An output signal of the comparator is input into the reset terminal of a timer circuit having a time measurement period longer than the power source frequency of an alternating current power source. A switch element of a discharging circuit is turned on by an output signal of the timer circuit.

11 Claims, 13 Drawing Sheets

(51) Int. Cl.
*H02M 7/217* (2006.01)
*H02M 1/32* (2007.01)
*H02M 1/12* (2006.01)

(52) U.S. Cl.
CPC ......... *H02M 1/32* (2013.01); *H02M 2001/322* (2013.01)

(58) Field of Classification Search
USPC ........................................................ 320/166
See application file for complete search history.

(56) References Cited

U.S. PATENT DOCUMENTS

| | | | | |
|---|---|---|---|---|
| 6,104,622 | A | * | 8/2000 | Shin ........................... 363/21.07 |
| 6,703,793 | B2 | | 3/2004 | Kitano |
| 2008/0001589 | A1 | * | 1/2008 | Shiroyama .................... 323/282 |
| 2009/0141523 | A1 | * | 6/2009 | Sugawara ....................... 363/89 |
| 2009/0309554 | A1 | * | 12/2009 | Fischer ......................... 320/166 |
| 2010/0309694 | A1 | * | 12/2010 | Huang ................. H02M 1/126 363/49 |
| 2012/0014145 | A1 | | 1/2012 | Koike |

FOREIGN PATENT DOCUMENTS

| | | |
|---|---|---|
| JP | 63-209466 | 8/1988 |
| JP | 63-209467 | 8/1988 |
| JP | 7-298612 | 11/1995 |
| JP | 2000-206159 | 7/2000 |
| JP | 2003-52176 | 2/2003 |
| JP | 2003-169474 | 6/2003 |
| JP | 2006-204028 | 8/2006 |
| JP | 2006-246666 | 9/2006 |
| JP | 2012-023832 | 2/2012 |

OTHER PUBLICATIONS

International Search Report of Corresponding PCT Application PCT/JP2011/070345 mailed Nov. 15, 2011.
Chinese Office Action dated Sep. 23, 2014 in corresponding Chinese Patent Application No. 201180039119.4.

* cited by examiner

POWER SUPPLY CONTROL CIRCUIT AND POWER SOURCE CUT-OFF DETECTION METHOD

CROSS-REFERENCE TO RELATED APPLICATIONS

This application is a continuation application, filed under 35 U.S.C. §111(a), of International Application PCT/JP2011/070345 filed on Sep. 7, 2011, and claims the foreign benefit of Japanese Application No. 2010-202903, filed Sep. 10, 2010 in the Japanese Intellectual Property Office and Japanese Application No. 2011-072037, filed Mar. 29, 2011 in the Japanese Intellectual Property Office, the disclosures of all of which are incorporated herein by reference.

BACKGROUND

1. Field

Embodiments of the present invention relate to a power supply control circuit connected to an alternating current power source via an input circuit having a capacitor, a power source cut-off detection method, and, particularly, a power supply control circuit and power source cut-off detection method such that a discharge of the capacitor is carried out when cutting off the alternating current power source.

2. Description of the Related Art

A power supply control circuit has heretofore been used as a common switching power supply in order to switch a full-wave rectified alternating current input voltage, generate a predetermined direct current voltage, and supply it to an external load. A circuit including a capacitor is normally used as an input filter used in a switching power supply for the purpose of noise removal. In order to safely dispose of residual electric charge accumulated in this kind of noise filter capacitor, a heretofore known arrangement is adopted such that a discharging resistor is connected in parallel to a capacitor, and when a plug is disconnected from AC lines, the residual electric charge of the capacitor is discharged via the resistor. With this method, as the discharging resistor is constantly connected to an alternating current input power source, a power loss occurs in the discharging resistor, and power consumption of the switching power supply increases, causing a decrease in power conversion efficiency.

FIG. 10 is a circuit diagram showing a configuration of a heretofore known switching power supply.

A rectifier circuit 103 is connected to AC lines 101 of a commercial power source via a filter circuit 102. The filter circuit 102 is configured of capacitors Cx1 and Cx2 and an inductor LF. A discharging resistor Rx which short-circuits opposing poles of the AC lines 101 is provided on the input side of the filter circuit 102.

Herein, the switching power supply is configured of a capacitor 104 and transformer 105 connected to the output side of the rectifier circuit 103, a switching element 106 connected in series to a primary winding 105P of the transformer 105, and a rectifying smoothing circuit 107 formed of a diode D and smoothing capacitor C connected to a secondary winding 105S of the transformer 105. Further, a turning on/off of the switching element 106 is controlled by an unshown PWM control circuit, thereby supplying a predetermined direct current voltage to a load (not shown) connected between direct current terminals 108a and 108b.

In this way, the switching power supply is configured so that the filter circuit 102 is generally used as an input section, thus preventing noise being emitted to the AC lines 101.

However, although the switching power supply is disconnected from the AC lines 101, electric charge remains in the capacitors Cx1 and Cx2 of the filter circuit 102, and there is a risk of getting an electric shock from the voltage of the electric charge. Therefore, a configuration is adopted such that a discharging resistor Rx is inserted between opposing poles of the AC lines 101, thus discharging the capacitors Cx1 and Cx2 when the switching power supply is disconnected from the AC lines 101.

The problem here is in that, as the discharging resistor Rx is constantly connected to the AC lines 101, power conversion efficiency decreases.

An electronic control device of an air conditioning system is disclosed in the below-cited related art patent literature document 1 (PTL 1). FIG. 11 is a circuit diagram showing the electronic control device configuring a heretofore known switching power supply disclosed in PTL 1.

The switching power supply of FIG. 11 includes a discharging resistor 202 between opposing poles of an alternating current input power source supplied from a plug 201, a resistor element 204 with resistance lower than that of the discharging resistor 202, to which a power failure detection element 203 which detects that an alternating current power source is being supplied is connected in series, and which is connected in parallel to these elements 202 and 203, and a switch 206 which is turned on/off by a controller 205 which operates by receiving a detection signal from the power failure detection element 203.

In the electronic control device 207 of PTL1, the resistor element 204 with a resistance value smaller than that of the discharging resistor 202 and the switch 206 are connected in series, it is detected that the plug 201 has been disconnected, and the switch 206 is turned on. Because of this, the resistor element 204 is connected only when the plug 201 is disconnected from the AC lines, meaning that it is possible to more quickly reduce a residual voltage between the opposing alternating current poles. The plug 201 supplies the alternating current power source to the electronic control device 207 via a connector 208, and the alternating current power source is supplied as the power source of the controller 205 through a noise filter 209 and a capacitor 210, and furthermore, a rectifying element 211 and a capacitor 212.

Herein, when the plug 201 is connected to the AC lines, no loss occurs as the discharging resistor 204 is disconnected from the circuit. As the discharging resistor 204 is connected when the plug 201 is disconnected, the capacitor 210 is discharged.

A problem of the switching power supply of PTL 1 is in that the whole structure becomes large because the switch 206 is used. Also, a particularly important problem includes a point of being short of specifics as no method of detecting that the plug 201 has been disconnected from the AC lines is disclosed.

Next, related art patent literature document 2 (PTL 2) cited below shows another switching power supply. FIG. 12 is a circuit diagram showing a configuration example of a heretofore known switching power supply disclosed in PTL 2.

Herein, a switching power supply arranged in such a way that a direct current voltage wherein an input alternating current voltage is rectified by a rectifier circuit 301 is switched by a main switching element Q, and control means 302 controls the switching in accordance with output voltage information feed back from the secondary side of a transformer N, thereby stabilizing an output voltage at a desired value, is characterized by including a plurality of series resistors R11 and R12 interposed on the input side of the rectifier circuit 301, and a resistor R2 which supplies a starting current from the connection point of the series resistors R11 and R12 to the control means 302.

In the switching power supply, a discharging resistor and control circuit starting resistor which have heretofore been individually provided are also used as the starting resistors R2, R11, and R12. Because of this, with the switching power supply of PTL 2, it is possible to reduce losses which have occurred individually.

However, with the switching power supply of FIG. 12, it is possible to reduce losses which have occurred individually, but it is not possible to eliminate a power loss completely.

Next, related art patent literature document 3 (PTL 3) cited below shows a direct current power supply arranged in such a way as to discharge a filter circuit capacitor. FIG. 13 is a circuit diagram showing a configuration example of a heretofore known switching power supply disclosed in PTL 3.

The direct current power supply includes an across-the-line capacitor Cy5 configuring a lowpass filter connected to both poles of an alternating current power source.

The direct current power supply includes first capacitors Cy1 and Cy2 connected to the respective poles of the alternating current power source, first diodes Dy3 and Dy5 whose anodes are connected to the other ends of the first capacitors Cy1 and Cy2, and second diodes Dy2 and Dy4 whose cathodes are connected to the anodes of the first diodes Dy3 and Dy5 respectively, one for each pole of the alternating current power source.

Also, the direct current power supply, as well as including an alternating current voltage rectifying bridge diode 401 with each pole of the alternating current power source as an input side, has a second capacitor Cy3 of which one end is connected to both of the cathodes of the two first diodes Dy3 and Dy5, and the other end is connected to the anodes of the two second diodes Dy2 and Dy4 and the negative pole of the alternating current voltage rectifying bridge diode 401. The direct current power supply further includes a first resistor Ry1 connected in parallel to both ends of the second capacitor Cy3, a first transistor Q3 into the gate of which is input a voltage across the second capacitor Cy3 and first resistor Ry1, and a second transistor Q4 into the gate of which is input the drain voltage of the first transistor Q3. The direct current power supply also includes a comparator 402 acting as an input voltage detector and a photo coupler 403 acting as a detector which emits a signal indicating that an external device driven by the direct current power supply is in operation.

Furthermore, in a condition in which the alternating current power source is connected, the first transistor Q3 is turned on, while the second transistor Q4 connected in cascade to the first transistor Q3 is turned off, causing no current to flow to a drain side resistor Ry4 or source side resistor Ry3 of the second transistor Q4. Also, when the alternating current power source takes on a disconnected state, the first transistor Q3 is substantially instantly turned off, and the second transistor Q4 is turned on, thus discharging the charging voltage of the across-the-line capacitor Cy5 within a predetermined time period through the drain side resistor Ry4 and source side resistor Ry3 of the second transistor Q4.

While an AC input is being supplied, the second capacitor Cy3 is constantly charged in a path from the first capacitor Cy1 through the first diode Dy3 to the second capacitor Cy3 or from the first capacitor Cy2 through the first diode Dy5 to the second capacitor Cy3. Because of this, the gate voltage of the first transistor Q3 becomes H (high, that is, the zener voltage of a zener diode Dy6), and the first transistor Q3 is maintained in an on-state. At this time, the gate voltage of the second transistor Q4 becomes L (low), and the second transistor Q4 is turned off.

Next, when the supply of the AC input is stopped, the second capacitor Cy3 is not charged, the gate voltage of the first transistor Q3 lowers, and the first transistor Q3 is turned off. Then, the gate of the second transistor Q4 is pulled up by the second resistor Ry2, and the second transistor Q4 is turned on. As the fourth resistor Ry4 connected to the second transistor Q4 is set to a low resistance, the across-the-line capacitor Cy5 is discharged for a short time.

RELATED ART PATENT LITERATURE DOCUMENTS

PTL 1: JP-A-2006-246666 (paragraph [0012], FIGS. 1 and 2)

PTL 2: U.S. Pat. No. 6,703,793 (FIG. 1), corresponding to Japanese Patent: JP-A-2003-52176

PTL 3: JP-A-2006-204028 (paragraph [0015] to [0041], FIG. 1)

SUMMARY

Problems Addressed by Embodiments of the Inventions

The electronic control device of the air conditioning system of PTL 1 becomes large in structure by using the switch 206 because it is conceivable that a relay circuit is practically needed as the switch 206. Also, PTL 1 is short of specifics as it discloses no method of detecting that the AC plug 201 has been disconnected.

With the switching power supply of PTL 2, it is possible to reduce a steady loss by double use of the resistors, but it is not possible to eliminate a power loss completely.

With the direct current power supply of PTL 3, it takes on a condition in which electric charge of the second capacitor Cy3 is constantly discharged by the resistor Ry1, and a discharge time constant defined by the product of these (Cy3·Ry1) cannot be taken to be so large. Consequently, there has been a problem in that the dissipation of current occurs here too. Also, a large area is necessary in order to dispose a capacitive element in an integrated circuit, but when the discharging circuit shown in FIG. 13 is provided in the integrated circuit, it is a problem that as many as three capacitors Cy1, Cy2, and cy3 are necessary for the discharging circuit.

The invention, in view of the foregoing, has an object of providing a power supply control circuit wherein no steady power loss occurs when discharging an input circuit capacitor. Also, the invention has an object of providing a power source cut-off detection method arranged in such a way as to detect that a plug has been disconnected from AC lines, and discharge accumulated electric charge remaining in the capacitor.

Means for Solving the Problems

In embodiments of the invention, in order to solve problems such as the heretofore described problems, there is provided the following power supply control circuit connected to an alternating current power source via an input circuit having a capacitor.

The power supply control circuit is characterized by including a discharging circuit which discharges accumulated electric charge remaining in the capacitor when cutting off the alternating current power source; level comparison component or means which generates a reset signal by comparing a signal proportional to the terminal voltage of the capacitor, or increasing and decreasing in accordance with an increase and decrease in the terminal voltage of the capacitor, with a reference signal level; and timing component or means, connected to the level comparison component or means, whose timing operation is reset by the reset signal, wherein the discharging circuit is arranged in such a way as to discharge the accumulated electric charge when it is detected by the timing component or means that a predetermined time measurement period has elapsed.

Also, in embodiments of the invention, in order to solve the heretofore described problems, there is provided a power source cut-off detection method which appropriately discharges accumulated electric charge remaining in a capacitor configuring an input circuit connected to an alternating current power source.

The power source cut-off detection method is characterized by including generating a reset signal by comparing a signal proportional to the terminal voltage of the capacitor, or increasing and decreasing in accordance with an increase and decrease in the terminal voltage of the capacitor, with a reference signal level; setting a predetermined time measurement period longer than the cycle of the alternating current power source, thus carrying out a timing operation; and discharging the accumulated electric charge when the timing operation is reset by the reset signal, and it is detected by the timing operation that the predetermined time measurement period has elapsed.

Advantageous Effects

According to embodiments of the invention, when the input circuit is not disconnected from the alternating current power source, the discharging circuit is not constantly connected, meaning that it is possible to reduce a power loss caused by a discharging resistor.

Also, according to the power source cut-off detection method of the power supply control circuit, it is possible to reliably discharge the accumulated electric charge remaining in the capacitor by detecting that the plug has been disconnected from the AC lines.

The heretofore described and other objects, features, and advantageous effects of embodiments of the invention will be clarified by the following description relating to the attached drawings illustrating preferred embodiments as examples of the invention.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which.

Figure 1:
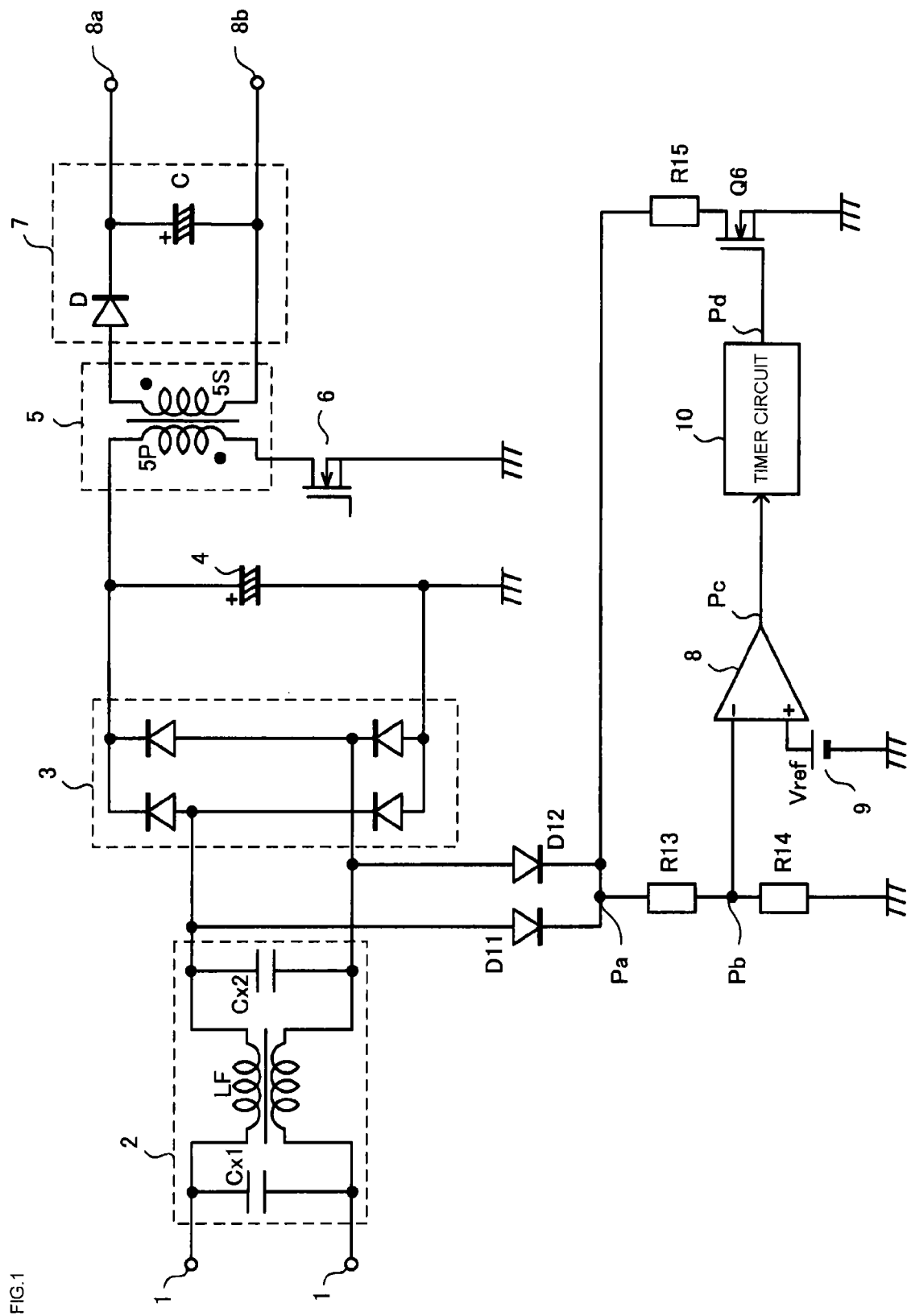
FIG. 1 is a diagram showing a configuration of a switching power supply of a first embodiment.

Additional aspects and/or advantages will be set forth in part in the description which follows and, in part, will be apparent from the description, or may be learned by practice of the invention.

DESCRIPTION OF EMBODIMENTS

Hereafter, a description will be given, referring to the drawings showing embodiments of switching power supplies, of a power supply control circuit and power source cut-off detection method of the invention.

First Embodiment

FIG. 1 is a diagram showing a configuration of a switching power supply of a first embodiment.

Figure 10:
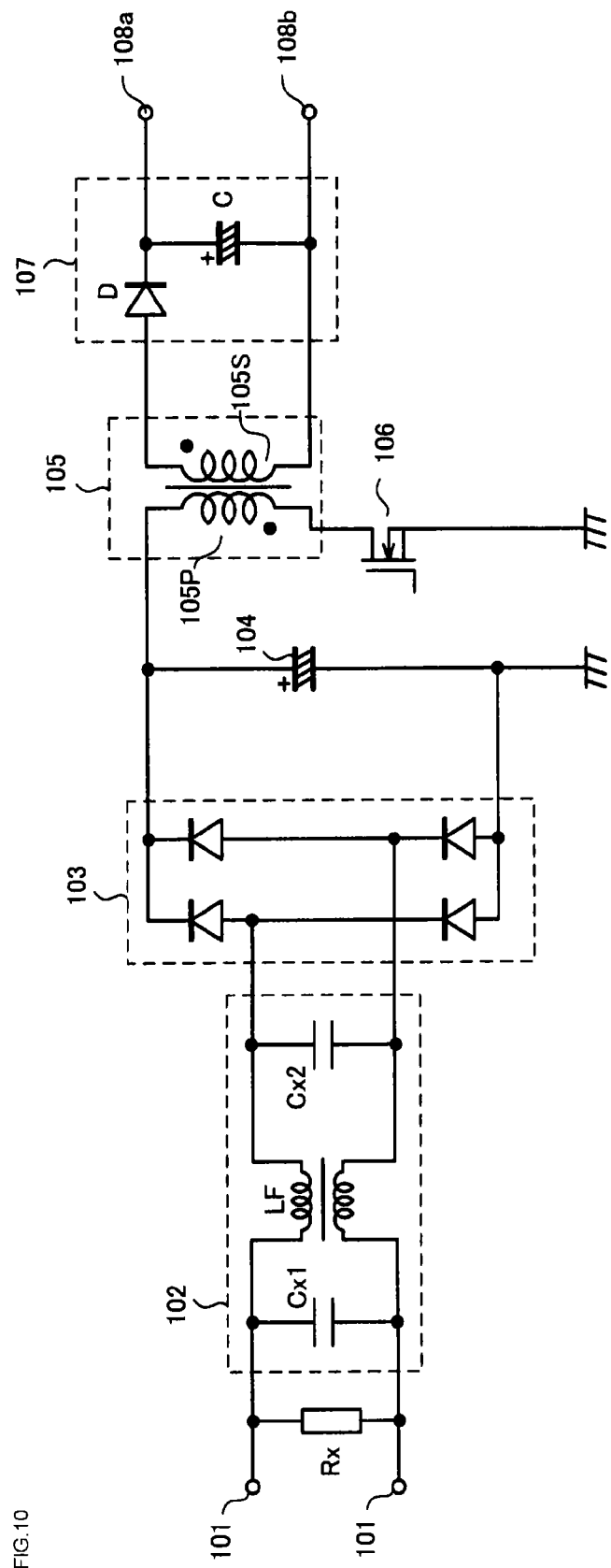
FIG. 10 is a circuit diagram showing a configuration of a heretofore known switching power supply.
Figure 11:
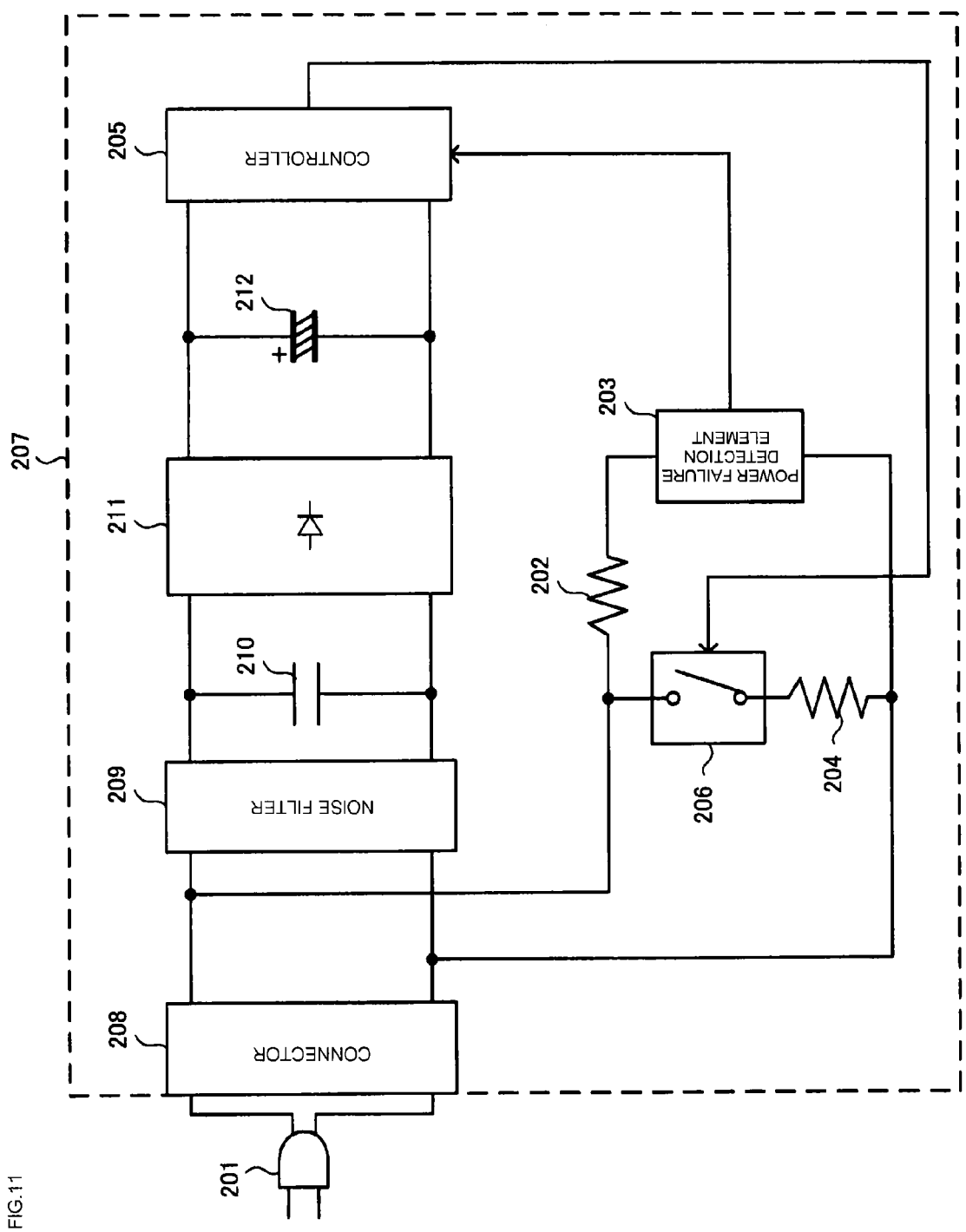
FIG. 11 is a circuit diagram showing an electronic control device configuring a heretofore known switching power supply disclosed in PTL 1.
Figure 12:
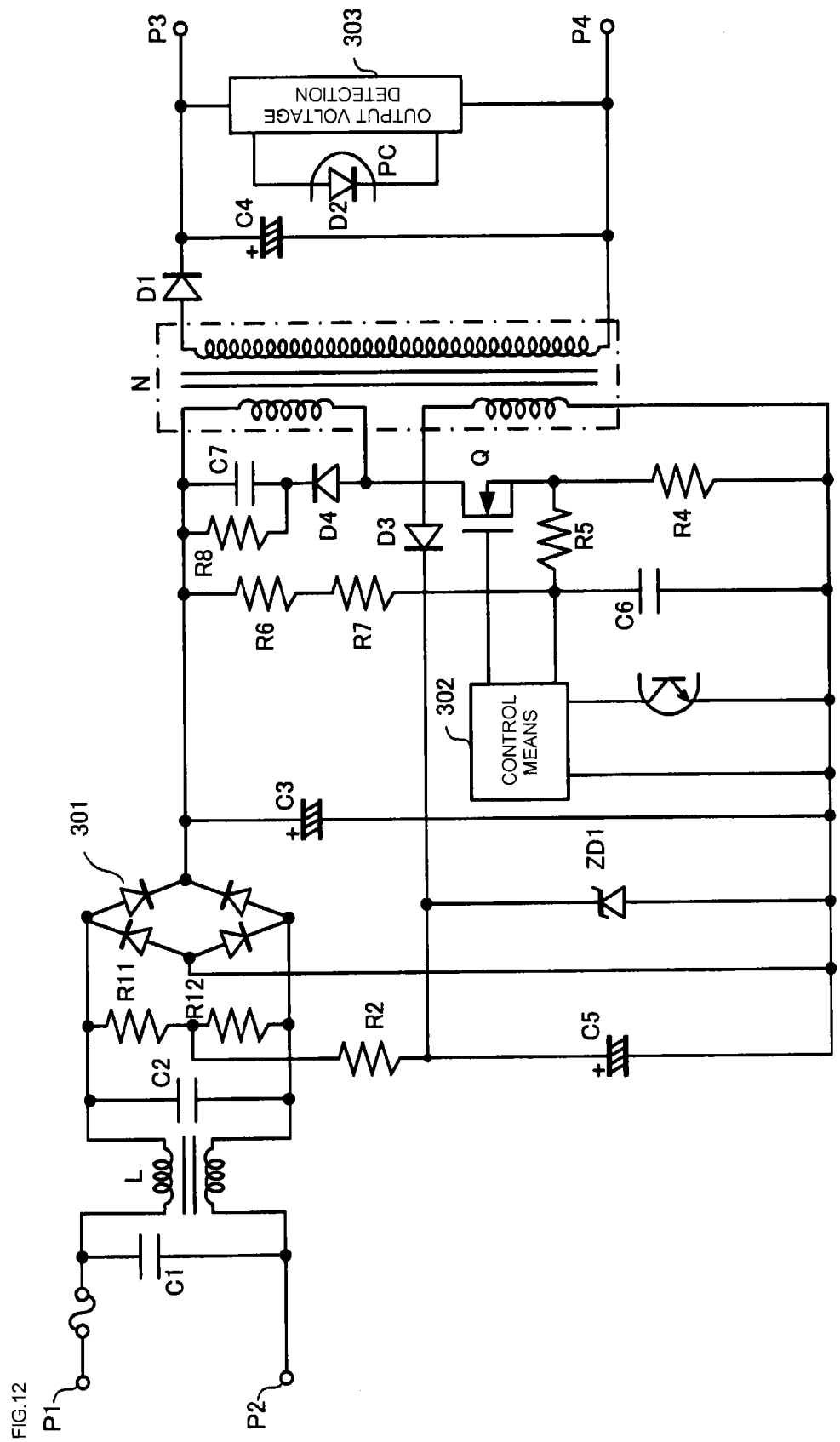
FIG. 12 is a circuit diagram showing a configuration example of a heretofore known switching power supply disclosed in PTL 2.
Figure 13:
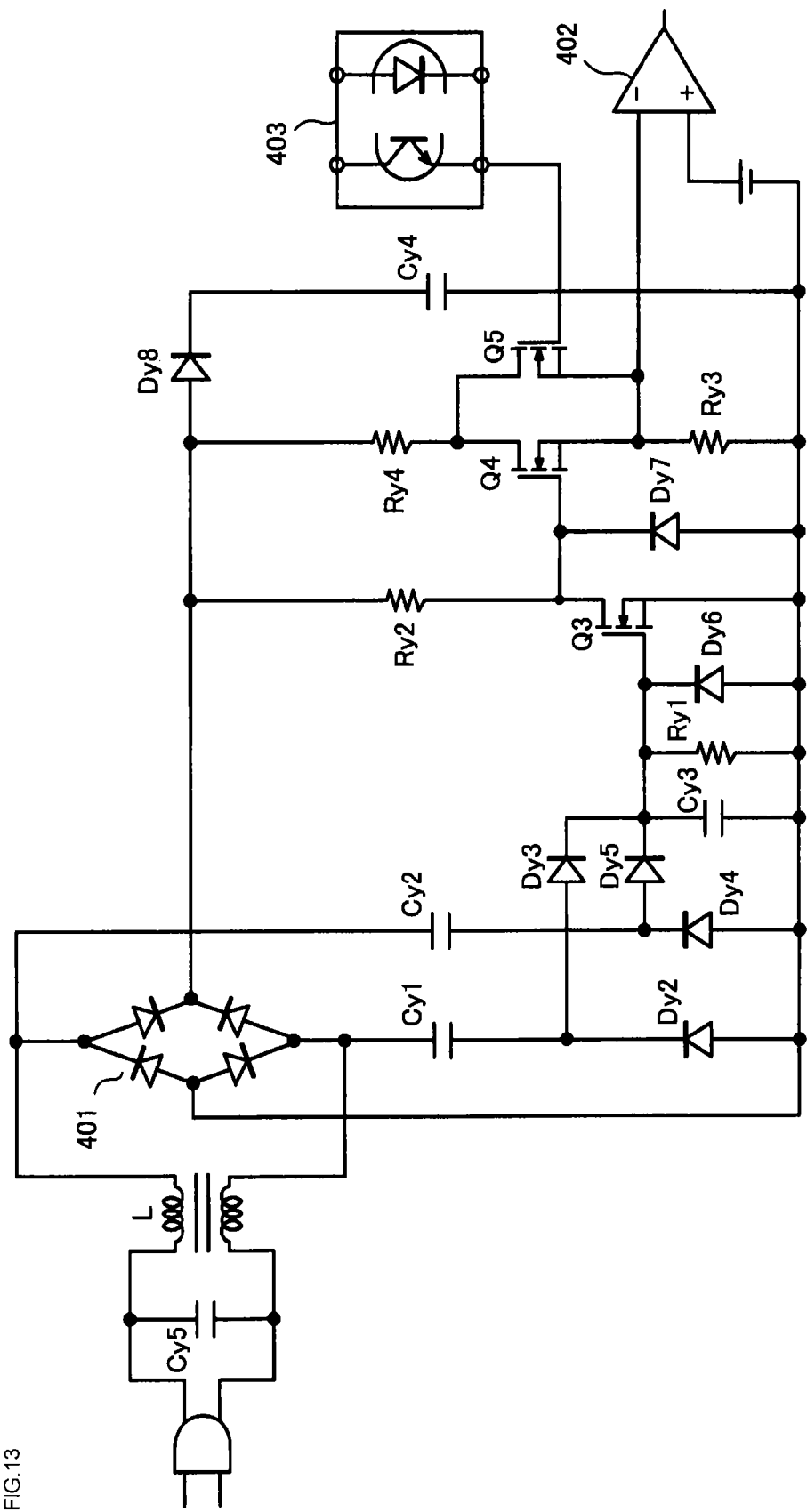
FIG. 13 is a circuit diagram showing a configuration example of a heretofore known switching power supply disclosed in PTL 3.

A rectifier circuit 3 is connected to AC lines 1 of a commercial power source via a filter circuit 2. The filter circuit 2 is configured of capacitors Cx1 and Cx2 and an inductor LF. A point differing from a heretofore known switching power supply of FIG. 10 is that no discharging resistor (Rx) is provided on the input side of the filter circuit 2.

Herein, the switching power supply is configured of an input capacitor 4 and transformer 5 connected to the output side of the rectifier circuit 3, a switching element 6 connected in series to a primary winding 5P of the transformer 5, and a smoothing circuit 7 formed of a diode D and smoothing capacitor C connected to a secondary winding 5S of the transformer 5. Further, a turning on/off of the switching element 6 is controlled by an unshown PWM control circuit, thereby supplying a predetermined direct current voltage to a load (not shown) connected between direct current terminals 8a and 8b.

In this way, the switching power supply is configured so that the filter circuit 2 is generally used as an input unit, thus preventing noise being emitted to the AC lines 1. However, although the switching power supply is disconnected from the AC lines 1, electric charge remains in the capacitors Cx1 and Cx2 of the filter circuit 2, and there is a risk of getting an electric shock from the voltage of the electric charge. The switching power supply of the embodiment is configured in such a way that, when it is disconnected from the AC lines 1, accumulated electric charge of the capacitors Cx1 and Cx2 is discharged by the following discharging circuit, without inserting a discharging resistor between opposing poles of the AC lines 1.

That is, the anodes of a pair of diodes D11 and D12 whose cathodes are connected together are each connected to the AC lines 1 to which both respective poles of an alternating current power source are connected, and a resistance circuit wherein resistors R13 and R14 are connected in series is connected to a connection point Pa of the diodes D11 and D12. A connection point Pb of the resistors R13 and R14 is connected to the inverting input terminal (−) of a comparator 8, and the non-inverting input terminal (+) thereof is connected to a reference power source 9. The comparator 8 compares an output voltage of the filter circuit 2 divided by the resistance circuit (the voltage of a high potential side terminal of two output terminals of the filter circuit 2) with a reference signal voltage, and determines the potential of an output terminal Pc of the comparator 8. Also, the output terminal of the comparator 8 is connected to the reset terminal of a timer circuit 10 set to a predetermined set time period (time measurement period), and a reset signal is supplied to the timer circuit 10 from the comparator 8.

In the timer circuit 10, the predetermined set time period (time measurement period) is set to a time period longer than at least 10 ms, to be described hereafter, in general, a time period longer than the frequency of the alternating current power source, for example, a time period two or more times longer.

The connection point Pa of the diodes D11 and D12 is further connected via a resistor R15 to the drain terminal of an N-type MOSFET configuring a switch element Q6, and the source terminal of the switch element Q6 is grounded. Also, the gate terminal of the N-type MOSFET configuring the switch element Q6 is connected to the timer circuit 10 reset controlled by the comparator 8. Consequently, the switch element Q6 is on/off controlled in accordance with the potential of an output terminal point Pd of the timer circuit 10.

Figure 2:
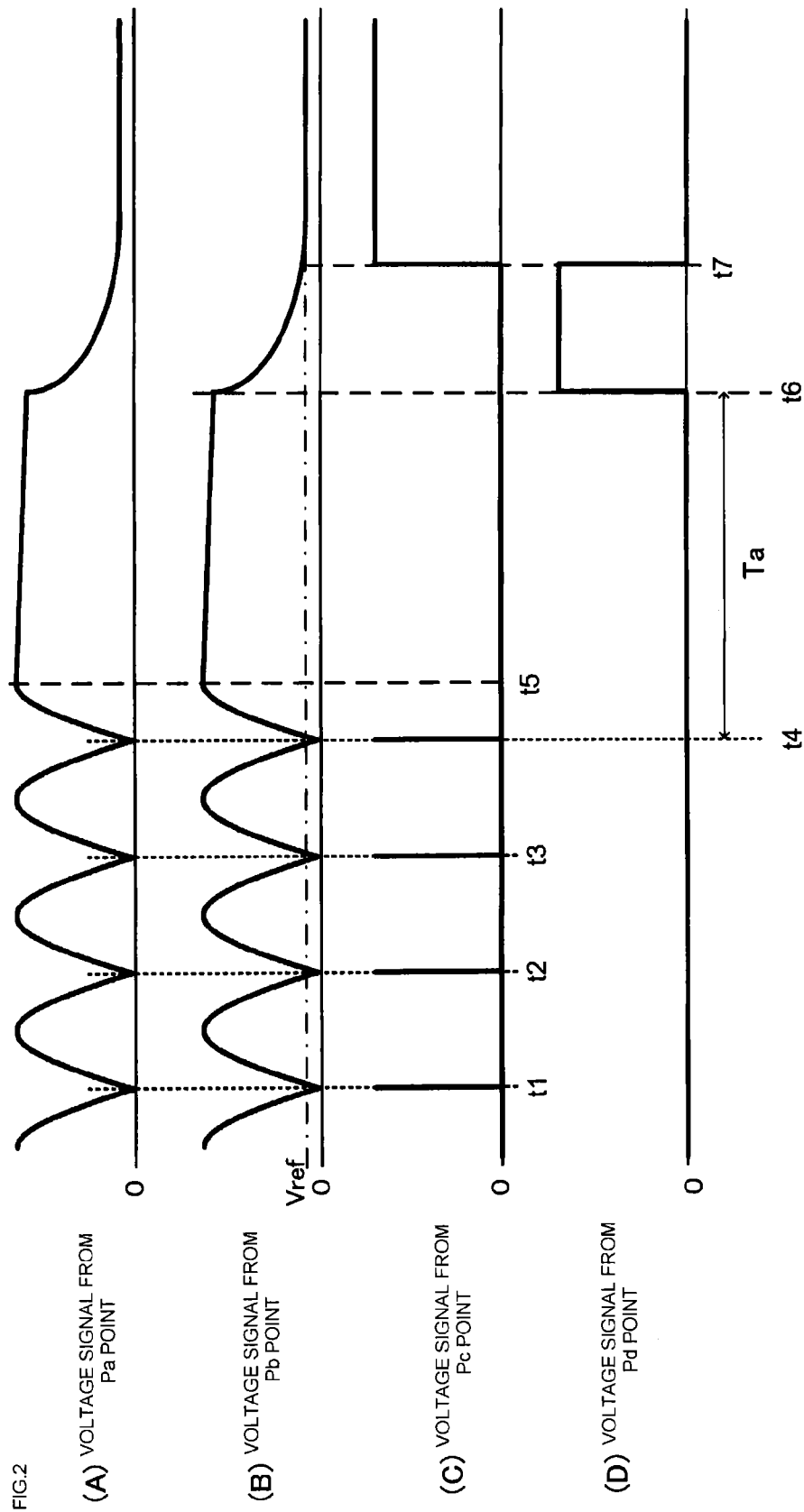
FIG. 2 is a waveform diagram for illustrating an operation of the switching power supply of FIG. 1.

FIG. 2 is a waveform diagram for illustrating an operation of the switching power supply of FIG. 1.

(A) of FIG. 2 shows a change of a voltage signal at the connection point Pa (shown as Pa point in the diagram, the same applying hereafter.).

A voltage waveform wherein the alternating current power source is full-wave rectified appears at the point Pa while the alternating current power source is being connected to the AC lines 1. (B) of FIG. 2 shows a voltage signal at the connection point Pb (shown as Pb point in the diagram, the same applying hereafter.) and a reference voltage Vref of the reference power source 9. Herein, a voltage resistance divided by the resistors R13 and R14 is input into the inverting input terminal (−) of the comparator 8, and compared with the reference voltage Vref.

Consequently, a frequency signal two times longer than the power source frequency appears as a reset signal at the output terminal Pc of the comparator 8 in accordance with the full-wave rectified waveform while the alternating current power source is being connected. (C) of FIG. 2 shows an input signal waveform for the timer circuit 10. Now, in the event that the power source frequency in the AC lines 1 is, for example, 50 Hz, pulse-like waveforms appear as reset signals with timings t1 to t4 of 10 ms intervals before a timing t5 at which the alternating current power source is disconnected. That is, in the event that an alternating current is on, the timer circuit 10 is reset every 10 ms. Consequently, there is no change in the potential of the output terminal Pd of the timer circuit 10 shown in (D) of FIG. 2.

When the alternating current power source is disconnected from the AC lines 1 and cut off at the timing t5, the accumulated electric charge of the capacitors Cx1 and Cx2 configuring the filter circuit 2 is maintained in a residual state, and the voltages at the connection points Pa and Pb do not lower any further. Because of this, no further reset signal is output from the comparator 8 to the timer circuit 10.

After the alternating current power source has been cut off, no further reset signal is input into the timer circuit 10. Because of this, when a time measurement period (Ta) of the timer circuit 10 is set to, for example, 50 ms, a gate signal output from the timer circuit 10 to the gate of the switch element Q6 at a timing t6 at which the time period Ta has elapsed from the timing t4 at which a last reset signal has been supplied becomes H (high). In this way, by the switch element Q6 configuring the discharging circuit being turned on, the accumulated electric charge of the capacitors Cx1 and Cx2 can be discharged via the diodes D11 and D12 and resistor R15.

The heretofore described switching power supply is arranged in such a way that the voltage dividing resistors R13 and R14 are connected to the AC lines 1, but the resistance values of the resistors R13 and R14 can be set regardless of a time period necessary to discharge the capacitors Cx1 and Cx2. That is, as it is possible to use resistors with a high resistance value as the resistors R13 and R14, it is possible to reduce a steady loss to substantially zero.

Figure 3:
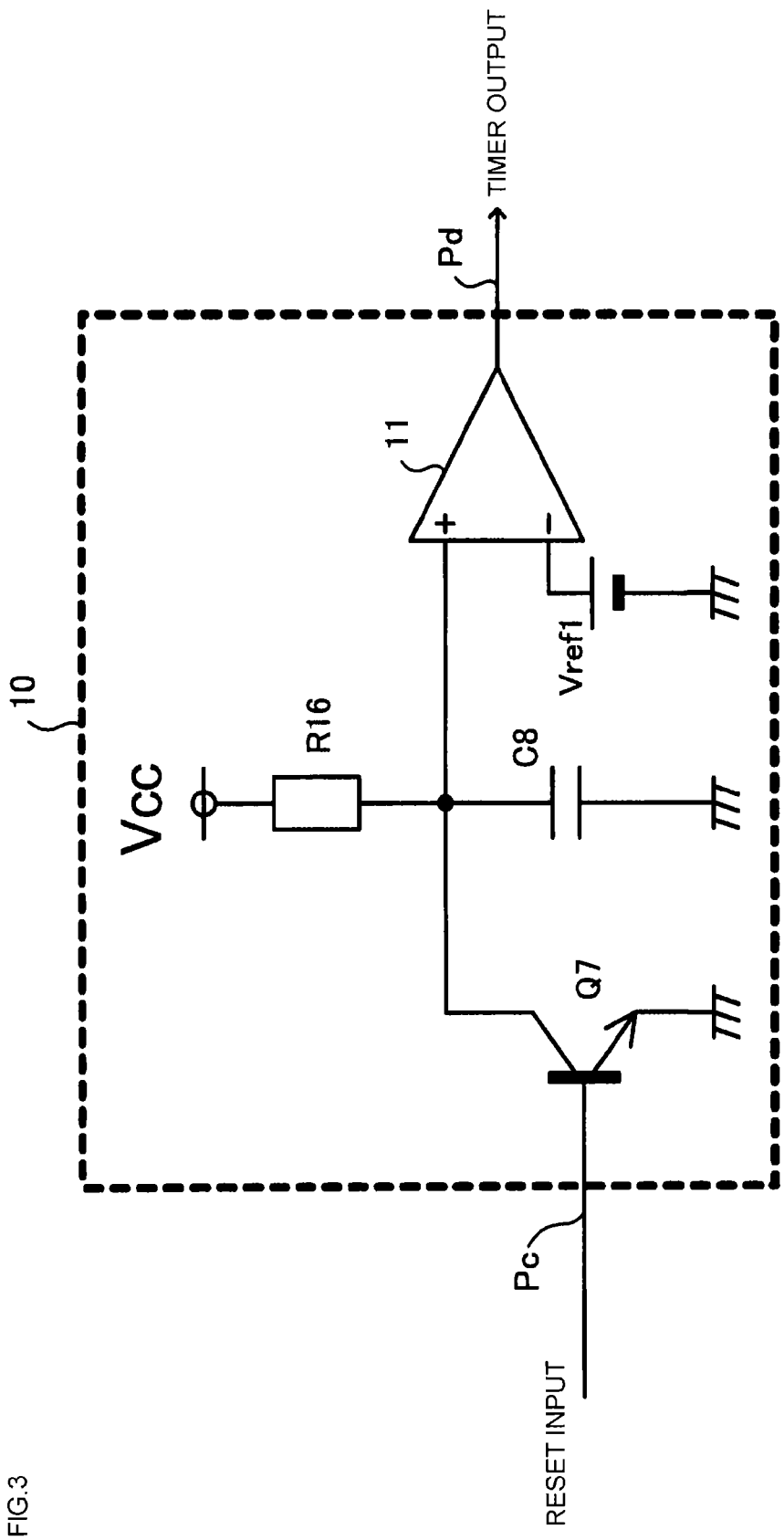
FIG. 3 is a circuit diagram showing a specific example of a timer circuit of FIG. 1.

FIG. 3 is a circuit diagram showing a specific example of the timer circuit of FIG. 1.

FIG. 3 shows a circuit configuration using a capacitor C8 and resistor R16 as one example of the timer circuit 10. That is, an output signal (also described as Pc) of the comparator 8 is connected to the base of a transistor switch Q7, which is the input terminal of the timer circuit 10, and when a reset signal from the comparator 8 is input into the timer circuit 10, the transistor switch Q7 is turned on, electric charge of the capacitor C8 is discharged, and a charge from a power source Vcc to the capacitor C8 is started the moment the reset signal is cleared. When a set time period determined by the capacitor C8 and resistor R16 elapses, a charging voltage exceeds a reference potential Vref1 of a comparator 11, thus increasing the potential of the timer circuit 10 output terminal Pd input into the switch element Q6 to H (high).

Consequently, by setting the set time period of the timer circuit 10 to a predetermined time measurement period longer than the cycle of the reset signal, for example, equal to or longer than the cycle of the alternating current power source, and preferably, two or more times longer than the cycle of the alternating current power source, the switch element Q6 configuring the discharging circuit operates after the time measurement period has exceeded the set time period when cutting off the alternating current power source, and it is thus possible to discharge accumulated electric charge.

Modification Example

Figure 4:
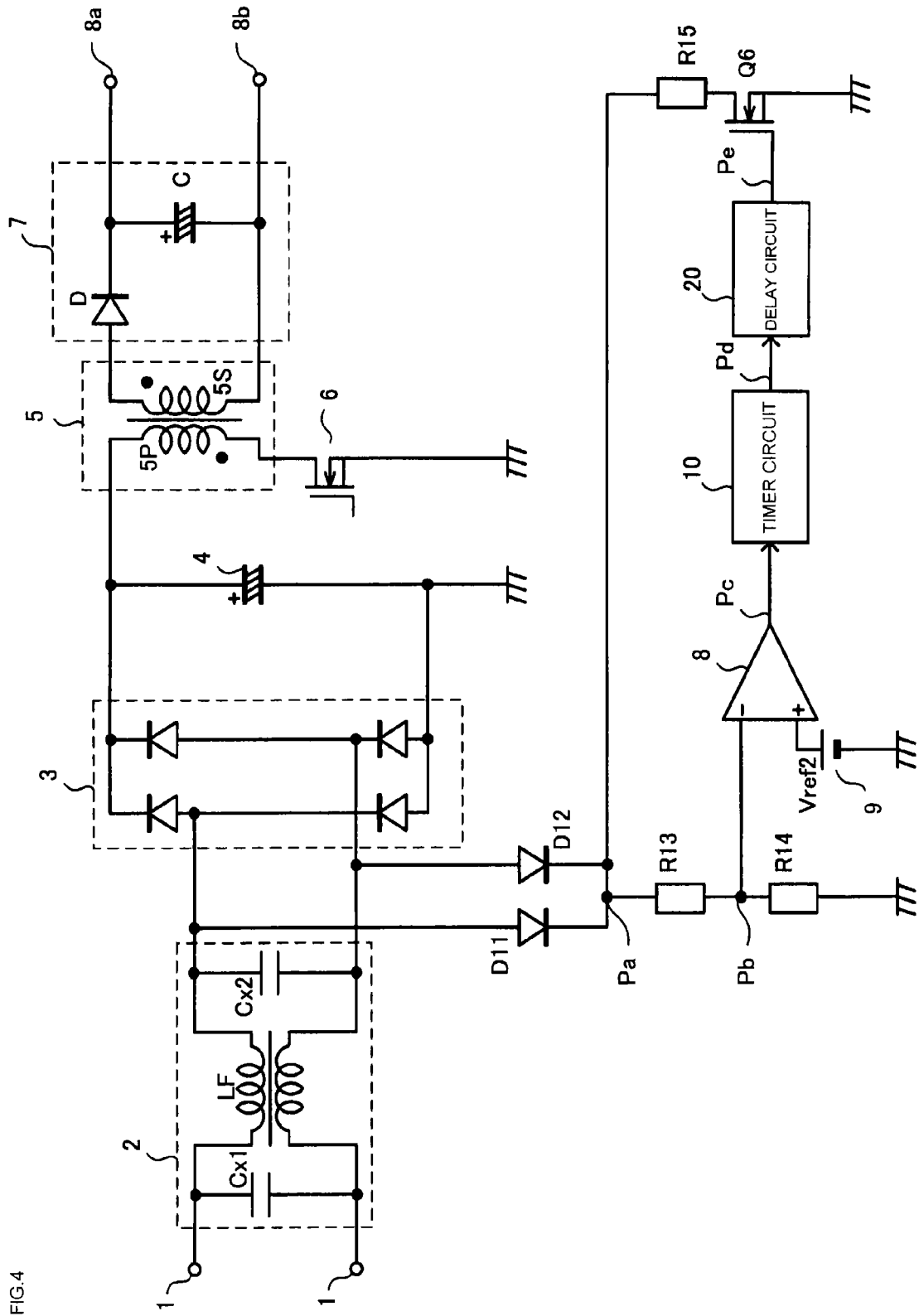
FIG. 4 is a circuit diagram showing a configuration of a modification example of the first embodiment.

FIG. 4 is a circuit diagram showing a configuration of a modification example of the first embodiment. A point differing from the circuit configuration in the first embodiment is that a delay circuit 20 is provided between the output terminal of the timer circuit 10 and the switch element Q6.

Figure 5:
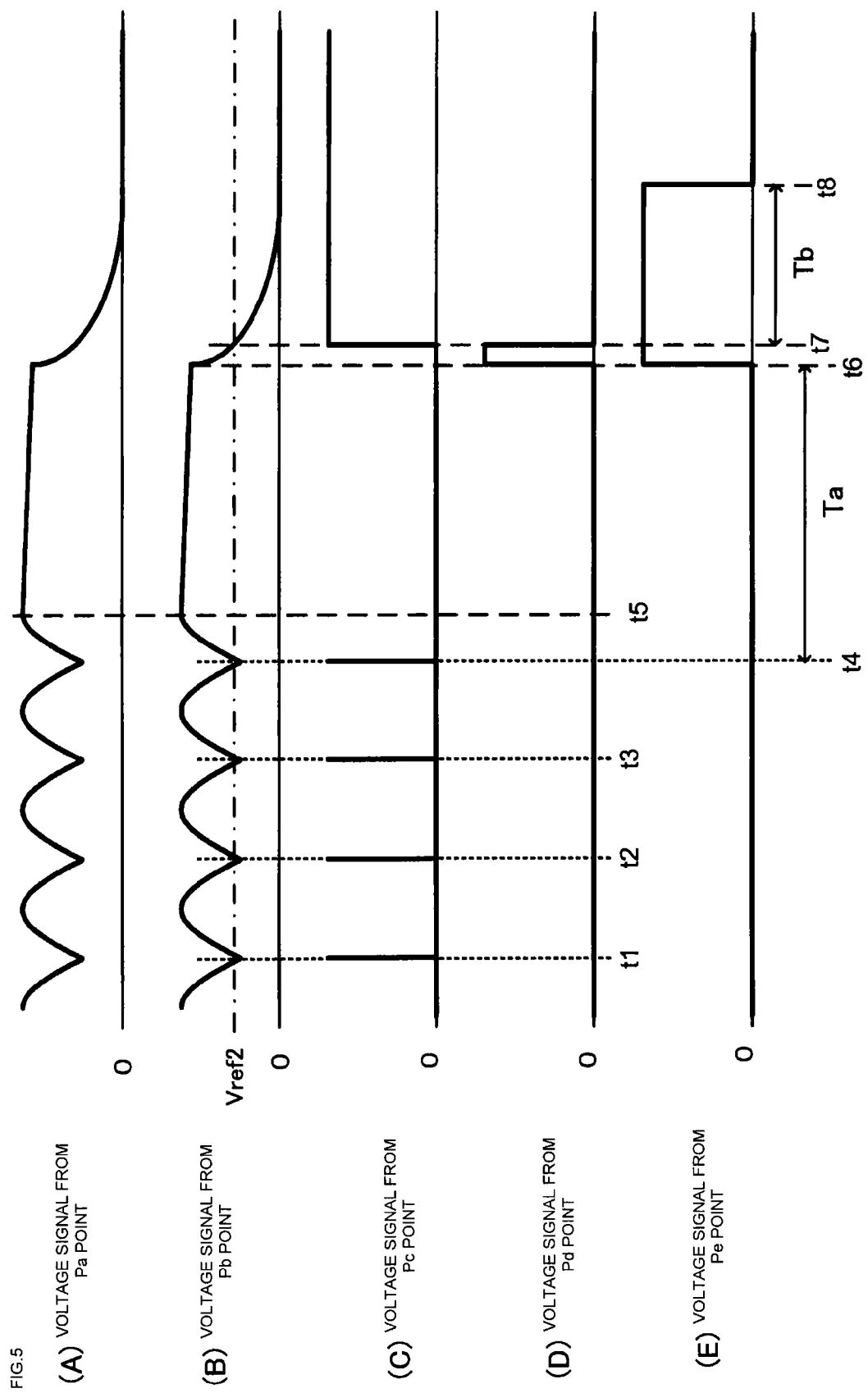
FIG. 5 is a waveform diagram for illustrating an operation of a switching power supply of FIG. 4.

FIG. 5 is a waveform diagram for illustrating an operation of the switching power supply of FIG. 4.

Heretofore, with a switching power supply which rectifies an alternating current power source, there has been a case in which the voltage of the connection point Pa does not lower to 0V due to the influence of parasitic capacitance associated with each of wiring lines connected to the diodes D11 and D12, resistors R13, R14, and R15, switch element Q6, and connection points Pa and Pb, or the like. That is, there has been a case in which the voltages of the connection points Pa and Pb increase and decrease in accordance with an increase and decrease in input circuit capacitor terminal voltage, but are not of any more complete proportionate relationship. Because of this, with level comparison component or means (the comparator 8) which generates a reset signal, it is necessary to set a reference signal voltage (Vref2) of the reference power source 9 of the comparator 8 to be higher in comparison with the voltage Vref shown in FIG. 2. Meanwhile, when the timer circuit 10 is of the configuration of FIG. 3, the timer circuit 10 is reset when the voltage of the connection point Pb reaches Vref2, and the voltage of the output terminal Pd of the timer circuit 10 becomes L (low), because of which the switch element Q6 is turned off, and a discharge stops. Vref2 is a somewhat high voltage, meaning that the accumulated electric charge of the capacitors Cx1 and Cx2 is not completely discharged.

Therefore, by extending a discharging time period by a time period (Tb) wherein a time period for which the switch element Q6 configuring the discharging circuit is turned on is set in the delay circuit 20, it is possible to maintain the on-state of the switch element Q6 until a timing t8 even after the output of the timer circuit 10 has changed to L (low) at a timing t7, as shown in (E) of FIG. 5, and lengthen a time period of operation of the discharging circuit. That is, a discharge continues beyond a voltage corresponding to the reference signal (Vref2) of the reference power source 9, and the accumulated electric charge of the capacitors Cx1 and Cx2 is reliably discharged.

Second Embodiment

Figure 6:
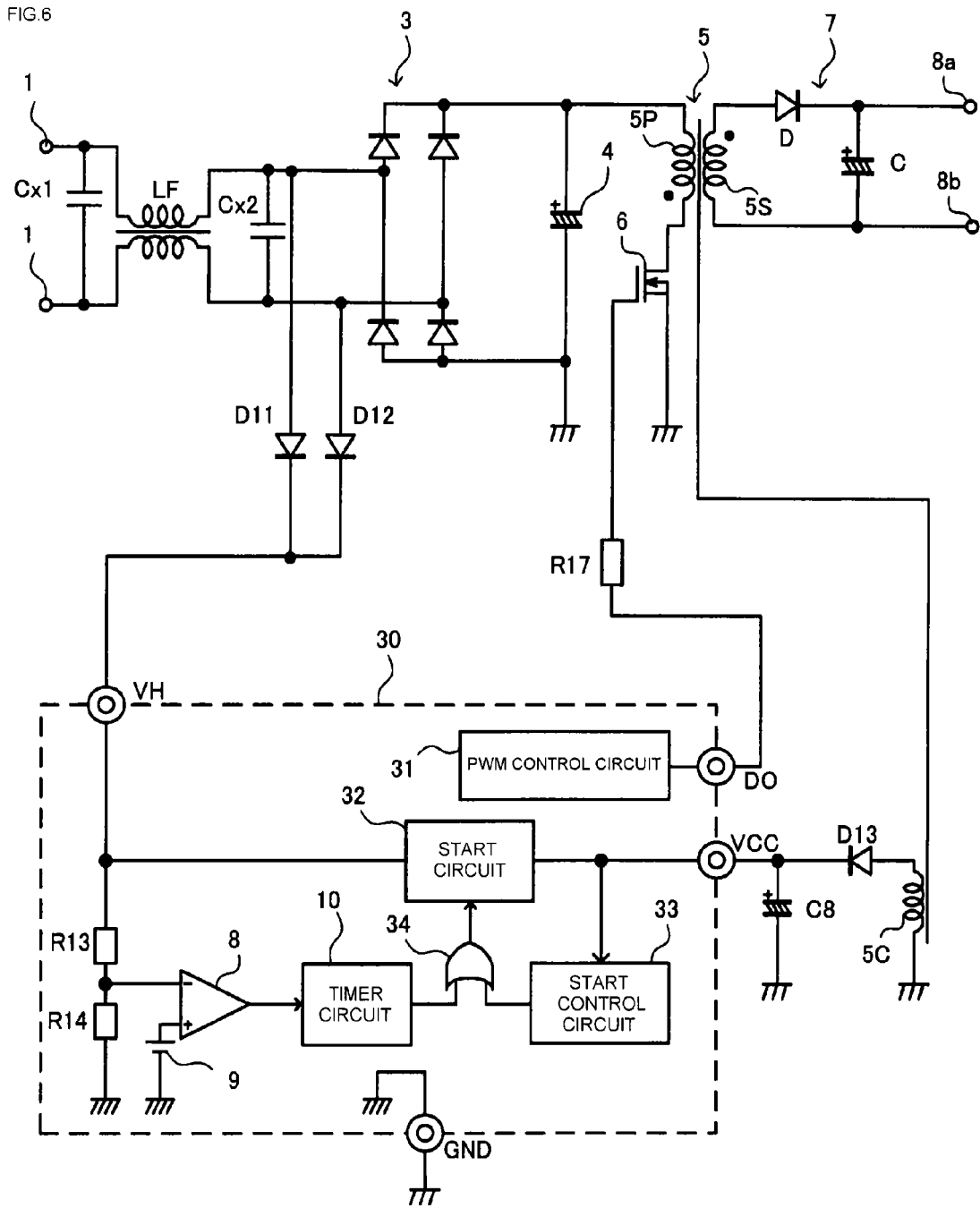
FIG. 6 is a diagram showing a configuration of a switching power supply of a second embodiment.

FIG. 6 is a diagram showing a configuration of a switching power supply of a second embodiment.

The switching power supply is configured so that a comparator 8 and a timer circuit 10 are incorporated in a control circuit (a power supply control circuit) 30. A full-wave rectified waveform of an alternating current power source is supplied to a VH terminal of the integrated circuit 30 via diodes D11 and D12. A PWM control circuit 31 which controls a switching element 6, a start circuit 32 which generates drive power at a power source starting time, and a start control circuit 33 are also configured in the control integrated circuit 30. As the external terminal of the integrated circuit 30, a DO terminal is connected to the gate of the switching element 6 via a resistor R17. Also, a VCC terminal, as well as being grounded via a capacitor C8, is connected to the cathode of a diode D13. The anode of the diode D13 is connected to one end of an auxiliary winding 5C of a transformer 5, and the other end of the auxiliary winding 5C is grounded.

The start control circuit 33 outputs a start control signal to the start circuit 32 via an OR circuit 34. Also, the timer circuit 10 outputs an on/off control signal to the start circuit 32 via the OR circuit 34. The capacitor C8 is charged with a starting current supplied from the terminal VH via the start circuit 32 when starting. Also, when operating the switching power supply, the start circuit 32 is placed in an off-state by a control signal from the start control circuit 33, but an induced voltage in the auxiliary winding 5C is rectified by the diode D13, and smoothed by the capacitor C8, thereby supplying a predetermined voltage to the VCC terminal.

A voltage waveform wherein the alternating current power source is full-wave rectified appears at a point Pa while the alternating current power source is being connected to AC lines 1. When the alternating current power source is cut off, an on signal is output from the timer circuit 10 via the OR circuit 34 to the start circuit 32. By so doing, the start circuit 32 is turned on, and by connecting the VH terminal and VCC terminal, it is possible to discharge accumulated electric charge of capacitors Cx1 and Cx2 of a filter circuit 2 from the capacitors Cx1 and Cx2 to the capacitor C8.

In this case, a voltage in the order of power source voltage Vcc of the integrated circuit 30 remains in the capacitors Cx1 and Cx2 of the filter circuit 2 even after the discharge of the capacitors Cx1 and Cx2. However, as the normal power source voltage Vcc of the integrated circuit 30 is in the order of 20V at the highest, there is no problem of safety when unplugging.

Also, the capacitor capacitance of the filter circuit 2, although it depends on the set used, is in the order of 1 µF or less. In comparison with this, a capacitor with in the order of tens to about a hundred µF is used as the capacitor C8 connected to the VCC terminal. Consequently, as there is a differential of in the order of 100 times between these capacitance values, it does not happen that the voltage of the capacitor C8 rises substantially even when residual electric charge of the filter circuit 2 is discharged to the VCC terminal, and there is no problem of safety.

As above, in this embodiment, the start circuit 32 incorporated in the integrated circuit 30 is turned on when cutting off the alternating current power source, and the accumulated electric charge of the capacitors Cx1 and Cx2 is discharged to the VCC terminal.

Figure 7:
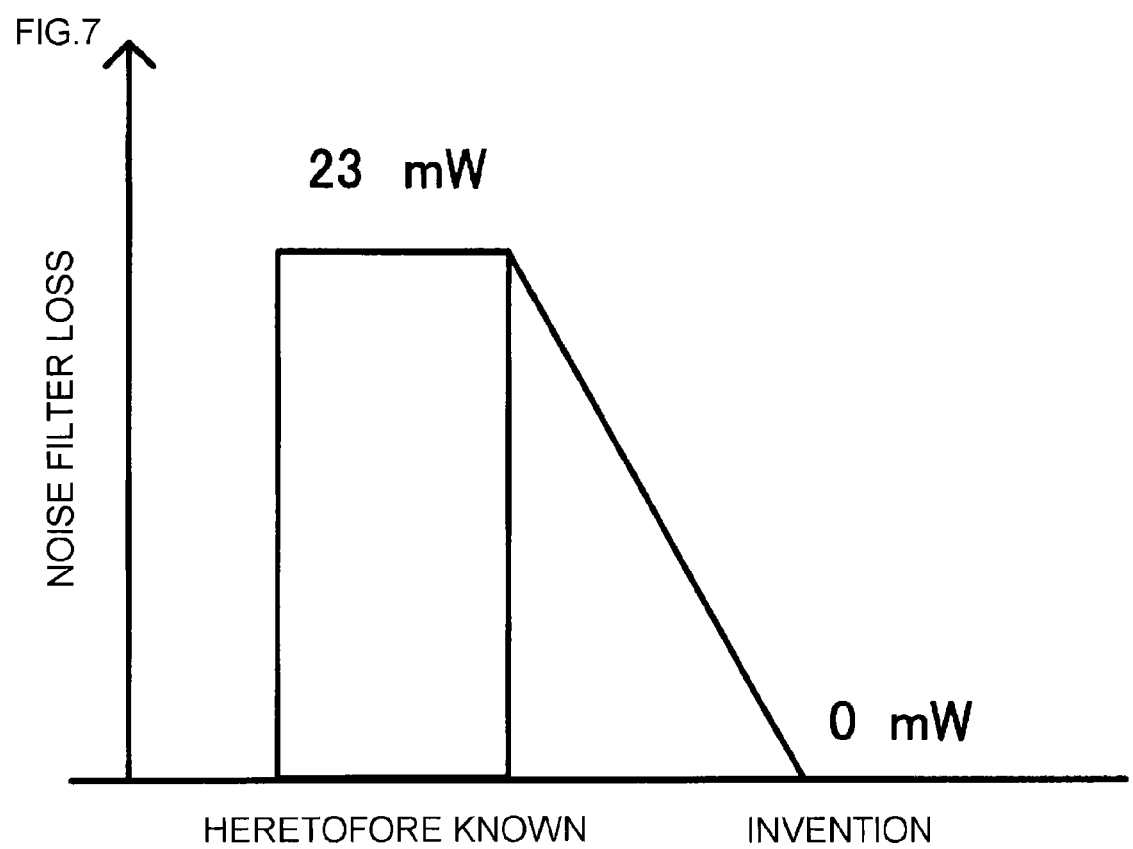
FIG. 7 is a diagram showing a power loss reduction effect of embodiments of the invention.

FIG. 7 shows a comparison of a power loss of an input filter in the heretofore known switching power supply shown in FIG. 10 and power losses of input filters in the switching power supplies of the first and second embodiments. The switching power supply of this embodiment has the advantage that a power loss (23 mW) of a heretofore known noise removal filter (input filter) can be reduced to 0 mW, as shown in FIG. 7.

Also, it is possible, in the first embodiment shown in FIG. 1 and the modification example shown in FIG. 4, to configure the resistors R13 and R14, comparator 8, reference power source 9, timer circuit 10, and delay circuit 20 in one integrated circuit, thus providing a power supply control circuit, as in the second embodiment.

Third Embodiment

Each of the heretofore described switching power supplies (FIGS. 1 and 6) of the first and second embodiments operates effectively only when the output voltage of the filter circuit input into the comparator 8 is definitely equal to or lower than the reference voltage Vref or reference signal voltage (Vref2) with timings in accordance with a commercial frequency. However, in order to realize a power conversion operation with still lower standby power, it is necessary to increase the resistance values of the resistors R13 and R14 configuring a series resistance circuit. Also, when a commercial alternating current voltage supplied from the AC lines 1 is a high input voltage such as 220V, it happens that the input voltage does not decrease to a value equal to or lower than the reference voltage Vref or reference signal voltage (Vref2) set in a case of a commercial alternating current voltage of 100V, even when the input voltage changes to a low phase angle region. This is because, when the resistance values of the resistors R13 and R14 are high, or a commercial alternating current voltage is high, parasitic capacitance associated with the connection point Pb cannot be completely discharged by the resistors R13 and R14. In this case, the voltage of the connection point Pb increases and decreases in accordance with an increase and decrease in input circuit capacitor terminal voltage, but cannot maintain any more complete proportionate relationship.

That is, when the input voltage of a commercial alternating current voltage is high, there is a danger of malfunction in that, although the switching power supply is not unplugged from the AC lines 1, no further reset signal is supplied to the timer circuit 10, the switch element Q6 is turned on, and a discharge current flows from the switch element Q6. Consequently, even though an alternating current voltage is of a commercial power source with a wide voltage range of 100 to 220V, the resistance values of the resistors R13 and R14 have to be reduced to some extent in order to cause a reliable reset operation of the timer circuit 10, and there is a problem in that standby power rises.

Figure 8:
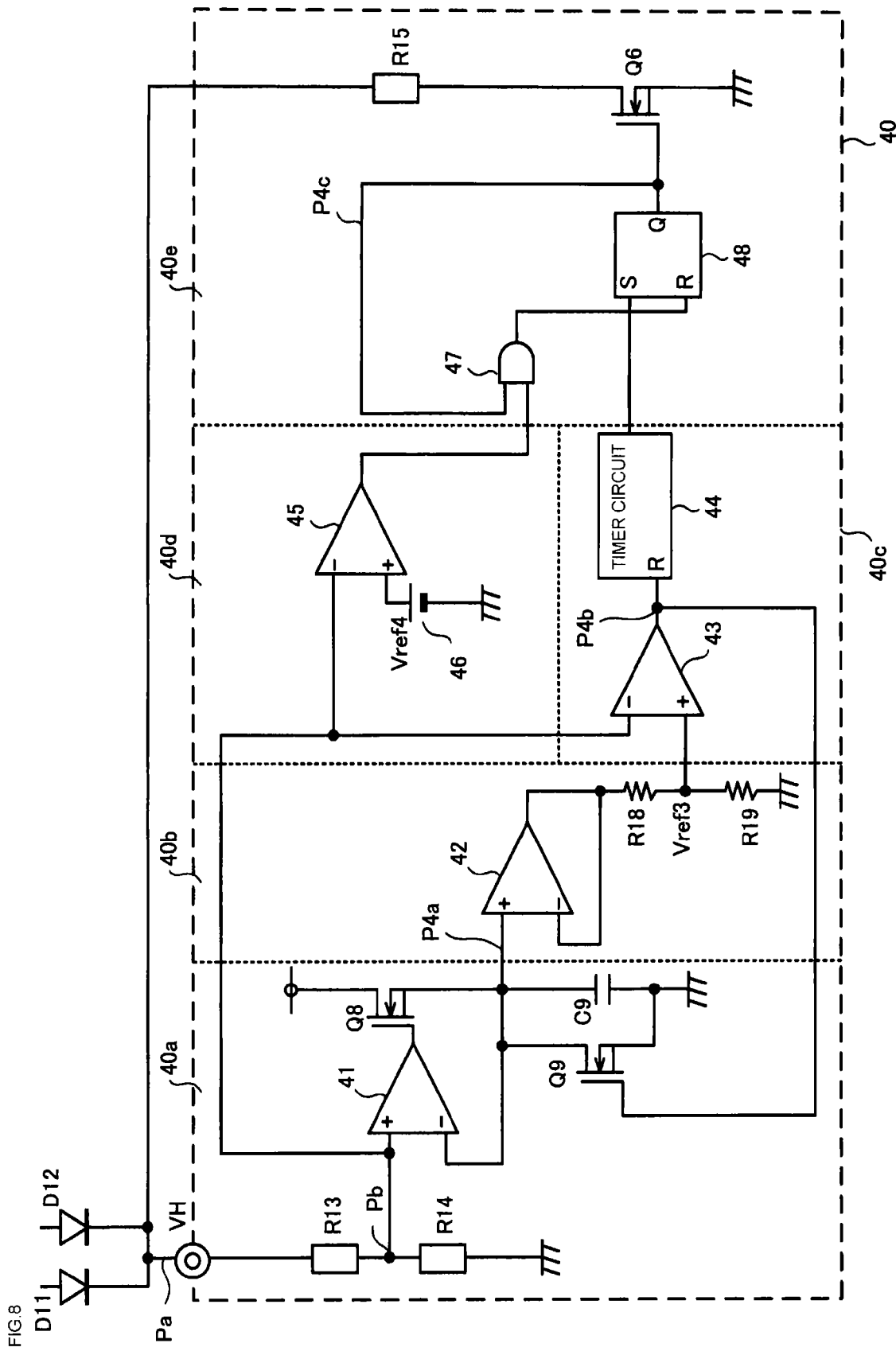
FIG. 8 is a diagram showing a configuration of a control integrated circuit of a switching power supply of a third embodiment.

FIG. 8 is a diagram showing a configuration of a control integrated circuit in a switching power supply of a third embodiment which solves the problem.

A control integrated circuit 40 configures a discharging circuit using a peak hold circuit 40a, a level down circuit 40b, a timer/reset circuit 40c, a discharge detection circuit 40d, and a discharge control circuit 40e. Herein, an all-wave rectified waveform of an alternating current power source is supplied to a series resistance circuit of resistors R13 and R14 via diodes D11 and D12. A connection point Pa of the diodes D11 and D12 is further connected via a resistor R15 to the drain terminal of an N-type MOSFET configuring a switch element Q6, and the source terminal of the switch element Q6 is grounded.

The switching power supply itself is configured of the input capacitor 4 and transformer 5 connected to the output side of the rectifier circuit 3, the switching element 6 connected in series to the primary winding 5P of the transformer 5, and the smoothing circuit 7 formed of a diode D and smoothing capacitor C connected to the secondary winding 5S of the transformer 5, in the same way as the power supply shown in FIG. 1. The discharging resistor (Rx) is not provided on the input side of the filter circuit 2, and when the switching power supply is disconnected from the AC lines 1, the accumulated electric charge of the capacitors Cx1 and Cx2 is discharged by the discharging circuit.

That is, the connection point Pb of the resistor R13 and resistor R14 is connected to the non-inverting input terminal (+) of an operational amplifier (an operational amplifier circuit) 41 configuring the peak hold circuit 40a, the inverting input terminal (−) of a comparator 43 configuring the timer/reset circuit 40c, and the inverting input terminal (−) of a comparator 45 configuring the discharge detection circuit 40d. The non-inverting input terminal (+) of the comparator 45 is connected to a reference power source 46.

The peak hold circuit 40a is configured in such a way that the output terminal of the operational amplifier 41 is connected to the gate of a transistor Q8, and a power source Vcc is connected to a capacitor C9 via the transistor Q8. Also, the connection point of the transistor Q8 and capacitor C9 is connected to the inverting input terminal (−) of the operational amplifier 41. Furthermore, a transistor switch Q9 is provided in parallel with the capacitor C9.

The level down circuit 40b is configured of an operational amplifier 42 and a series resistance circuit, and a voltage signal is input into the non-inverting input terminal (+) of the operational amplifier 42 from an output terminal P4a of the peak hold circuit 40a. Also, the operational amplifier 42, by the output terminal and inverting input terminal (−) thereof being connected together, configures a voltage follower circuit. The output terminal of the operational amplifier 42 is connected to one resistor R18 of the series resistance circuit. The resistor R18 is grounded via a resistor R19, and a voltage signal from the connection point of the resistor R18 and resistor R19 is supplied to the timer/reset circuit 40c as a reference voltage Vref3.

The timer/reset circuit 40c is configured of the comparator 43 and a timer circuit 44. In the comparator 43, the reference voltage Vref3 is supplied to the non-inverting input terminal (+) thereof, and compared with a voltage-divided full-wave rectified waveform supplied from the connection point Pb of the resistor R13 and resistor R14. Also, the output terminal of the comparator 43 is connected to a reset terminal (R) of the timer circuit 44. As a predetermined set time period (time measurement period), in general, a time period longer than the frequency of the alternating current power source, for example, a time period two or more times longer, is set in the timer circuit 44.

The discharge detection circuit 40d includes the comparator 45 corresponding to the heretofore described comparator 8 in the first or second embodiment. The non-inverting input terminal (+) of the comparator 45 is connected to the reference power source 46, and the output terminal thereof is connected to an AND gate 47 of the discharge control circuit 40e.

The discharge control circuit 40e is configured of the AND gate 47 and a flip-flop circuit 48. A set input terminal (S) of the flip-flop circuit 48 is connected to the output terminal of the timer circuit 44 of the timer/reset circuit 40c. Also, an output terminal (Q) of the flip-flop circuit 48, as well as being connected to the gate terminal of the switch element Q6, is connected to the AND gate 47.

Figure 9:
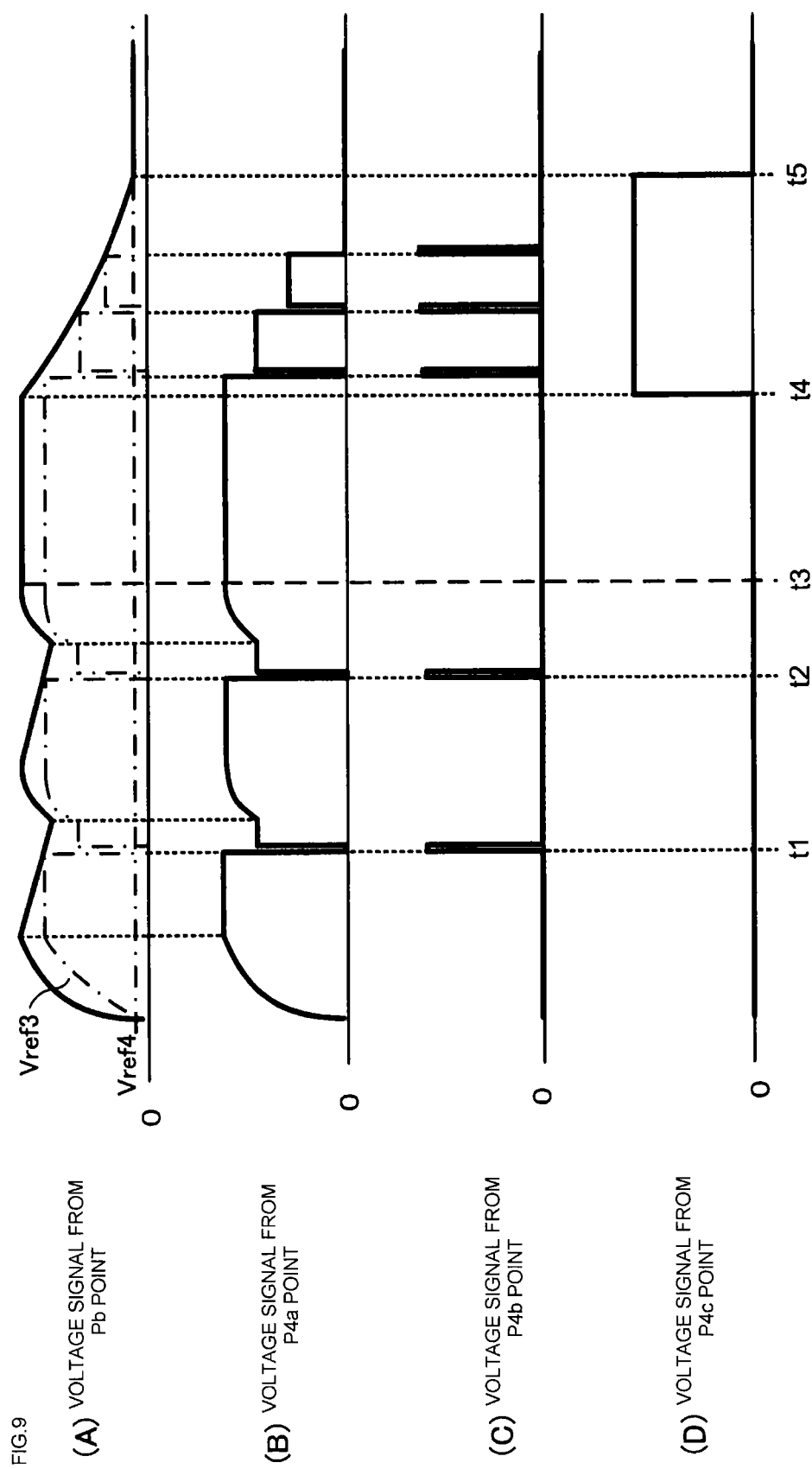
FIG. 9 is a waveform diagram for illustrating an operation of the control integrated circuit of FIG. 8.

Next, a description will be given of an operation of the switching power supply of the third embodiment configured in this way. FIG. 9 is a waveform diagram for illustrating an operation of the control integrated circuit of FIG. 8.

(A) of FIG. 9 shows a voltage signal wherein a full-wave rectified waveform of the alternating current power source generated at the connection point Pb is voltage divided. Herein, (A) of FIG. 9 shows a case in which parasitic capacitance associated with the connection point Pb is not completely discharged during a switching cycle, and it is difficult for the potential of the connection point Pb to lower. The full-wave rectified waveform of the alternating current power source is supplied to a VH terminal of the integrated circuit 40 via the diodes D11 and D12. In the peak hold circuit 40a, when the voltage signal at the connection point Pb rises, the transistor Q8 conducts in such a way that the voltage of the inverting input terminal (−) of the operational amplifier 41 follows the voltage of the non-inverting input terminal (+) (in such a way as to cause virtual short circuit), and electric charge is injected into the capacitor C9. When an alternating current input voltage passes its peak value and starts lowering every commercial power source frequency (50 Hz/60 Hz) cycle, the voltage signal at the connection point Pb also lowers but, as there is no discharge path in the capacitor C9, a voltage signal at a P4a point is maintained at a peak value as shown in (B) of FIG. 9.

In the level down circuit 40b, the peak value maintained by the capacitor C9 is buffered (impedance converted) by the voltage follower circuit formed of the operational amplifier 42, and furthermore, the reference voltage Vref3 divided and generated by the series resistance circuit is output to the timer/reset circuit 40c. Herein, by selecting the resistance values of the resistor R18 and resistor R19, it is possible to reduce the peak value at an optional rate. That is, it is possible to set the voltage division ratio of the resistor R18 and resistor R19 in accordance with the lowering property of the voltage of the connection point Pb.

By setting the voltage division ratio of the resistor R18 and resistor R19 in accordance with the lowering property of the voltage of the connection point Pb, it is possible to arrange in such a way that the potential of the connection point Pb reliably becomes equal to or lower than the reference voltage Vref3 every commercial frequency cycle, that is, at timings t1 and t2 shown in FIG. 9, when the alternating current input voltage is activated. A voltage signal at a P4b point shown in (C) of FIG. 9, being an output signal of the comparator 43, reaches an H level at the timings t1 and t2. In this way, when the H level voltage signal from the P4b point is supplied to the reset terminal (R) of the timer circuit 44, the timer circuit 44 is reset. At this time, the voltage signal from the P4b point turns on the transistor switch Q9 of the peak hold circuit 44, thus discharging the electric charge of the capacitor C9, meaning that the voltage signal from the P4b point returns to an L level for a short time. When the voltage signal from the P4b point returns to the L level, the transistor switch Q9 is turned off, and a potential of the connection point Pb at the moment the transistor switch Q9 is turned off is stored in the capacitor C9. As the potential of the connection point Pb continues to lower immediately after the transistor switch Q9 has been turned off, the capacitor C9 maintains the potential of the connection point Pb at the moment the transistor switch Q9 is turned off. Subsequently, the potential of the connection point Pb reverses the lowering, and when it exceeds the voltage of the capacitor C9, the voltage of the capacitor C9 starts to rise.

In the event that the switching power supply is disconnected from the AC lines 1 in the vicinity of an alternating current input peak, the accumulated electric charge of the capacitor Cx1 and Cx2 is held as there is no path to discharge the electric charge. In this condition, the voltage-divided alternating current waveform of the VH voltage does not become equal to or lower than a constant voltage. Because of this, a condition in which the output signal of the comparator is maintained at the L level continues beyond the time period set in the timer circuit 44.

That is, when the alternating current input voltage is cut off at the timing t3, the potential level of the voltage signal at the connection point Pb does not lower, meaning that the comparator 43 is maintained at the L level, and no reset signal is output to the timer circuit 44 as the voltage signal from the P4b point. Because of this, time expires at a timing t4, and the timer circuit 44 inverts the output to the H level, thus setting the flip-flop circuit 48. When the flip-flop circuit 48 is set and the output thereof becomes the H level, the switch element Q6 is turned on, and it is thus possible to discharge electric charge accumulated in an input filter capacitor until a subsequent timing t5. When the potential of the connection point Pb reaches the reference voltage Vref4 of the reference power source 46 at the timing t5, the outputs of the comparator 45 and AND gate 47 become the H level, the flip-flop circuit 48 is reset, and the switch element Q6 is turned off, thus preparing for when the alternating current input voltage is activated again. As the potential of the connection point Pb lowers and becomes equal to or lower than the reference voltage Vref3 before the timing t5 is reached, and the timer circuit 44 is reset, a set input of the flip-flop circuit 48 is off.

As above, in this embodiment, a configuration is adopted such that the reference voltage Vref3 with which the full-wave rectified waveform is monitored to detect that the alternating current input voltage has been cut off can be lowered at an optional rate with respect to the peak value maintained by the capacitor C9. Because of this, even when it is difficult for the VH voltage to lower from the peak value at a low phase angle, such as when the commercial alternating current voltage is in a wide range of 100 to 220V, or when standby power is reduced by setting partial resistance with respect to alternating current voltage supplied from the VH terminal to be high, it is possible to reliably detect that the switching power supply has been disconnected from the AC lines 1 by appropriately setting the voltage division ratio of the resistors R18 and R19 in accordance with the lowering property of the potential of the connection point Pb.

Although a few embodiments illustrating aspects of the invention have been shown and described above, it would be appreciated by those skilled in the art that the invention, many modifications and alterations of which can be made by those skilled in the art, is not limited to the above illustrated and described exact configurations and applications, and corresponding modification examples and equivalents are all deemed to be in the scope of the invention encompassed by the appended claims and their equivalents.

DESCRIPTION OF REFERENCE NUMERALS AND SIGNS

1 AC line
2 Filter circuit
3 Rectifier circuit
4 Input capacitor
5 Transformer
6 Switching element
7 Smoothing circuit
8, 11, 43, 45 Comparator
8a, 8b Direct current terminal
9, 46 Reference power source
10, 44 Timer circuit
20 Delay circuit
30, 40 Integrated circuit
31 PWM control circuit
32 Start circuit
33 Start control circuit
34 OR circuit
40a Peak hold circuit
40b Level down circuit
40c Timer/reset circuit
40d Discharge detection circuit
40e Discharge control circuit
41, 42 Operational amplifier
47 AND gate
48 Flip-flop circuit
C Smoothing capacitor
Cx1, Cx2, C8, C9 Capacitor
D, D11, D12, D13 Diode
LF Inductor
Q6 Switch element
Q7, Q9 Transistor switch
Q8 Transistor
R13 to R19 Resistor

What is claimed is:

1. A power supply control circuit connected to an alternating current power source via an input circuit having a capacitor, comprising:
   a discharging circuit which discharges accumulated electric charge remaining in the capacitor when the alternating current power source is cut off;
   a peak hold circuit which detects a voltage signal increasing and decreasing in accordance with an increase and decrease in a terminal voltage of the capacitor, and, during each cycle of a plurality of cycles of the alternating current power source, holds a peak voltage representing a peak voltage of the alternating current power source and discharges the held peak voltage in response to a reset signal;
   a level comparison component which generates the reset signal by comparing the voltage signal with a reference voltage signal level supplied to the level comparison component based on the peak voltage representing the peak voltage of the alternating current power source held by the peak hold circuit; and
   a timer circuit, connected to the level comparison component, whose timing operation is reset by the reset signal, the timer circuit configured to cause the discharging circuit to discharge the accumulated electric charge when the timer circuit detects that the timing operation has elapsed a predetermined time measurement period without being reset.

2. The power supply control circuit according to claim 1, further comprising:
   a level down circuit which generates the reference voltage signal level based on the peak voltage representing the peak voltage of the alternating current power source held by the peak hold circuit, the level down circuit provided between the peak hold circuit and level comparison component.

3. The power supply control circuit according to claim 1, wherein the predetermined time measurement period is longer than the cycle duration of the alternating current power source.

4. The power supply control circuit according to claim 3, wherein the discharging circuit includes a switch element which discharges the accumulated electric charge by both ends of the capacitor being connected to a ground potential.

5. The power supply control circuit according to claim 4, wherein the timer circuit causes the switch element to conduct by outputting a pulse signal output from the timer circuit after the timing operation has elapsed the time measurement period without being reset.

6. The power supply control circuit according to claim 5, wherein a delay circuit is provided between the timer circuit and the switch element.

7. The power supply control circuit according to claim 3, wherein the discharging circuit discharges the accumulated electric charge by both ends of the capacitor being connected to the power source terminal of the power supply control circuit.

8. The power supply control circuit according to claim 1, wherein the level comparison component includes a pair of diodes whose anodes are connected to either end of the capacitor and whose cathodes are connected to each other, a resistance circuit connected between the cathodes of the pair of diodes and the ground potential, and a comparator which compares a voltage divided by the resistance circuit with a reference signal voltage.

9. The power supply control circuit according to claim 1, wherein the input circuit is a noise removal filter for removing noise emitted to the alternating current power source.

10. A power source cut-off detection method which discharges accumulated electric charge remaining in a capacitor configuring an input circuit connected to an alternating current power source, comprising:
    detecting a voltage signal increasing and decreasing in accordance with an increase and decrease in a terminal voltage of the capacitor;
    during each cycle of a plurality of cycles of the alternating current power source, carrying out a holding operation of holding a peak voltage representing a peak voltage of the voltage signal;
    generating a reference voltage signal level from the peak voltage representing the peak voltage of the alternating current power source held by the holding operation;
    generating a reset signal by comparing the voltage signal with the reference voltage signal level, the reset signal causing the holding operation to reset;
    setting a predetermined time measurement period longer than the cycle duration of the alternating current power source, thus carrying out a timing operation that is reset by the reset signal; and
    discharging the accumulated electric charge when the timing operation detects that the predetermined time measurement period has elapsed without the timing operation being reset.

11. The power supply control circuit according to claim 2, wherein the level down circuit generates the reference voltage signal level using a voltage divider, included in the level down circuit, configured such that the voltage signal becomes lower than the reference a voltage signal level during each cycle of the plurality of cycles of the alternating current power source.

* * * * *